(12) United States Patent
Rhee et al.

(10) Patent No.: US 6,524,902 B2
(45) Date of Patent: Feb. 25, 2003

(54) METHOD OF MANUFACTURING CMOS SEMICONDUCTOR DEVICE

(75) Inventors: Hwa-Sung Rhee, Seoul (KR); Geum-Jong Bae, Kyunggi-do (KR); Tae-Hee Choe, Seoul (KR); Sang-Su Kim, Kimpo-shi (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/001,619

(22) Filed: Oct. 23, 2001

(65) Prior Publication Data

US 2002/0113294 A1 Aug. 22, 2002

(30) Foreign Application Priority Data

Feb. 9, 2001 (KR) .......................................... 2001-6407

(51) Int. Cl.$^7$ .......................................... H01L 21/8238
(52) U.S. Cl. ...................................... 438/199; 257/369
(58) Field of Search ........................ 257/616, 204–205, 257/412, 69, 19, 369, 195, 385; 438/257, 199, 933, 218, 581–583, 752

(56) References Cited

U.S. PATENT DOCUMENTS

| | | | |
|---|---|---|---|
| 5,356,821 A | * 10/1994 | Naruse et al. | 148/DIG. 9 |
| 6,127,216 A | * 10/2000 | Yu | 438/238 |
| 6,180,499 B1 | * 1/2001 | Yu | 438/199 |
| 6,252,283 B1 | 6/2001 | Gardner et al. | 257/407 |
| 6,281,559 B1 | * 8/2001 | Yu et al. | 257/407 |
| 6,362,055 B2 | * 3/2002 | Lin et al. | 438/275 |
| 6,432,763 B1 | * 8/2002 | Yu | 438/217 |
| 6,451,676 B2 | * 9/2002 | Wurzer et al. | 438/528 |

FOREIGN PATENT DOCUMENTS

| | | | |
|---|---|---|---|
| WO | WO 98/13880 | 2/1998 | ............ H01L/29/49 |
| WO | WO 01/61749 | 8/2001 | ....... H01L/21/8238 |

OTHER PUBLICATIONS

King, et al., "A Polycrystalline–Si$_{1-x}$Ge$_x$–Gate CMOS Technology, IEDM, Technology Digest," 1990, pp. 253–256.

Lee, et al., "Optimized Poly–Si$_{1-x}$Ge$_x$–Gate Technology for Dual Gate CMOS Application," VLSI Technology Digest of Technology Papers, 1998, pp. 190–191.

(List continued on next page.)

Primary Examiner—Phat X. Cao
Assistant Examiner—Thao X. Le
(74) Attorney, Agent, or Firm—Mills & Onello LLP

(57) ABSTRACT

In a CMOS semiconductor device having a substrate, a gate insulating layer formed on the substrate, at least one first polysilicon gate formed over the substrate in at least one PMOS transistor region, and at least one second polysilicon gate formed over the substrate in at least one NMOS transistor region, a total amount of Ge in the first polysilicon gate is the same as that in the second polysilicon gate, a distribution of Ge concentration in the first and/or second polysilicon gate is different according to a distance from the gate insulating layer, and Ge concentration in a portion of the first polysilicon gate adjacent to the gate insulating layer is higher than that in the second polysilicon gate. The Ge concentration in the portion of the first polysilicon gate adjacent to the gate insulating layer is more than two times as high as that in the second polysilicon gate. For example, it is preferable that the Ge concentration in the portion of the first polysilicon gate adjacent to the gate insulating layer is more than 20%, and Ge concentration in a portion of the second polysilicon gate adjacent to the gate insulating layer is below 10%.

11 Claims, 9 Drawing Sheets

OTHER PUBLICATIONS

Ponomarev, et al., "Gate Workfunction Engineering Using Poly–(Si,Ge) for High–Performance 0.18μm CMOS Technology", IEDM 1997 Technical Digest, pp. 829–832, Dec. 1997.

Rhee, H.S., et al., "Ge–Redistributed Poly–Si/SiGe Stack Gate (GRPSG) for High Performance CMOSFETs", 2001 Symposium on VLSI Technology Digest of Technical Papers, pp. 61–62, Jun. 12–14, 2001.

Ponomarev, et al., "High Performance Deep SubMicron CMOS Technologies with Polycrystalline–SiGe Gates," IEEE Transactions on Electron Devices, vol. 47, No. 4, Apr. 2000, pp. 848–855.

* cited by examiner

METHOD OF MANUFACTURING CMOS SEMICONDUCTOR DEVICE

This application relies for priority upon Korean Patent Application No. 2001-6407, filed on Feb. 9, 2001, the contents of which are herein incorporated by reference in their entirety.

FIELD OF THE INVENTION

The present invention relates to a complementary metal oxide silicon (CMOS) semiconductor device and method of manufacturing the same, and more particularly to a CMOS semiconductor device having polysilicon gates containing germanium (Ge) and method of manufacturing the same.

BACKGROUND OF THE INVENTION

A CMOS semiconductor device is a device in which p-channel metal oxide silicon (PMOS) transistors along with n-channel metal oxide silicon (NMOS) transistors are formed to operate cooperatively with each other. In the CMOS semiconductor device, operation efficiency and speed are greatly improved as compared with a semiconductor device using only PMOS transistors and/or bipolar transistors. Accordingly, CMOS devices are commonly used as high-performance semiconductor devices. Particularly, as the elements incorporated into the device are integrated to a high degree and minimized to increase voltage characteristic and speed, a dual gate type CMOS semiconductor device, in which p-type and n-type impurities are implanted in respective polysilicon gates of corresponding impurity type transistor regions, is widely used. The dual gate type CMOS semiconductor device has the advantages of reinforcing of surface layer portions of channels and enabling symmetrical low voltage operation.

In the fabrication of the dual gate type CMOS semiconductor device, boron is usually used as a dopant doped or implanted in a polysilicon gate layer forming gate electrodes or gates of PMOS transistors. The impurity implantation of doping p-type impurity such as boron is often carried out along with an ion implantation process for forming source/drain regions.

However, where boron is used as a dopant in the impurity implantation, it may diffuse and escape into p-channels through a thin gate insulating layer, unless it is insufficiently implanted or activated. Particularly, since the gate insulating layer is formed to a very thin thickness, for example several tens of angstroms (Å), the problem is more serious. If boron ions escape from the polysilicon gate layer in the impurity implantation, boron concentration in the polysilicon gate layer adjacent to the gate insulating layer will be reduced and the poly-gate depletion effect (PDE) will result.

The boron ions diffused into the gate insulating layer and the p-channels may increase p-type impurity concentration of surface layer portions of the p-channels to interconnect sources and drains, thereby resulting in a problem in which current is allowed to flow under low voltage. Also, conductivity of the gates from which the boron ions escape is decreased and thickness of the gate insulating layer is substantially increased, so that a problems of supplying insufficient voltage to the p-channels and reducing drain current may result. These contrary problems unstably vary operation voltage of the PMOS transistors, thereby deteriorating reliability of the semiconductor device. Also, the PDE may act to degrade characteristics of the gate insulating layer and the p-channels.

To solve the problems such as the PDE and degradation in characteristics of the PMOS transistors thereby, there has been proposed a method of increasing solubility of boron by adding Ge in a polysilicon gate layer forming gate electrodes or gates (IEDM, Technology Digest 1990 pp. 253–256). Since the polysilicon gate layer containing Ge has a high boron solubility, boron ions are not diffused well to the outside of the polysilicon gate layer in an annealing process and the like.

As methods of adding Ge in the polysilicon gate layer, there are a method of adding a source gas such as $GeH_4$ gas when the polysilicon layer is formed by means of a chemical vapor deposition (CVD) method, and a method of implanting Ge ions. In the method of adding a source gas, a silicon-germanium (SiGe) gate layer is formed by injecting $SiH_4$ gas and $GeH_4$ gas as a source gas into a CVD chamber by means of an in situ method. In the method, the SiGe gate layer having a Ge content of 20 to 30% and a high boron solubility can be obtained. However, since the CVD is a thermal process, a photo-resist pattern cannot be used to cover partially a NMOS transistor region. Thus, the SiGe gate layer is also formed in the NMOS transistor region. Also, Ge generally shows different PDE according to the kind of dopant. Therefore, high Ge concentration or content of 20 to 30% in the SiGe layer of the NMOS transistor region may decrease solubility of n-type impurity. For example, if Ge concentration is more than 10%, at the SiGe layer of the NMOS transistor region, Ge can enlarge the PDE and can decrease capacitance to degrade characteristics of the transistors.

It has been reported that in consideration of the whole of the CMOS semiconductor device, the polysilicon gate layer should have Ge concentration of 20% (VLSI Technology Digest of Technology Papers 1998 pp. 190–191). In the case of the dual gate type CMOS semiconductor device requiring a high concentration implantation to improve performance, Ge concentration in the polysilicon gates of the NMOS and PMOS transistors should be maintained below 10% and more than 30%, respectively. However, it is difficult to satisfy these two conditions simultaneously.

Also, in the case in which Ge is contained in the polysilicon gates, for example Ge concentration is beyond 5 to 15%, there is problem that it is difficult to form titanium or cobalt silicide layer portions on the polysilicon gates. To solve the problem, a method of forming a poly-SiGe layer near a gate insulating layer and a polysilicon layer on the upper portion of the poly-SiGe layer can be used. However, in this method, it was also impossible for Ge concentration in the gates of NMOS and PMOS transistors to be maintained below 10% and more than 30%, respectively.

Accordingly, a new CMOS semiconductor device and method of manufacturing the same, which can make Ge concentration in gates of PMOS transistors to be relatively higher than that in gates of NMOS transistors, is required.

SUMMARY OF THE INVENTION

It is an object of the present invention to provide an improved CMOS semiconductor device and method of manufacturing the same, which can satisfy conditions of Ge concentration for gates of PMOS and NMOS transistors to prevent depletion of gate impurities in the gates.

It is another object of the present invention to provide an improved CMOS semiconductor device and method of manufacturing the same which can form a metal layer portion of material such as titanium and cobalt and a silicide layer portion on each polysilicon gate containing Ge.

It is another object of the present invention to provide an improved CMOS semiconductor device and method of manufacturing the same, which can increase impurity concentration of polysilicon gates to allow the device under a high integration to be operated at a low voltage.

These and other objects are provided, according to the present invention, by a CMOS semiconductor device having a substrate, a gate insulating layer formed on the substrate, at least one first polysilicon gate formed over the substrate in at least one PMOS transistor region, and at least one second polysilicon gate formed over the substrate in at least one NMOS transistor region. In accordance with the invention, a total amount of Ge in the first polysilicon gate is the same as that in the second polysilicon gate, a distribution of Ge concentration in the first and/or second polysilicon gate is different, i.e., varies, according to a distance from the gate insulating layer, and Ge concentration in a portion of the first polysilicon gate adjacent to the gate insulating layer is higher than that in the second polysilicon gate.

In the present invention, Ge concentration in a portion of polysilicon gates adjacent to the gate insulating layer is important since it is directly influenced by PDE. Accordingly, it is regarded as an effective Ge concentration of the polysilicon gates.

In one embodiment of the present invention, Ge concentration in the portion of the first polysilicon gate adjacent to the gate insulating layer is more than two times as high as that in the second polysilicon gate. Preferably, the Ge concentration in the portion of the first polysilicon gate adjacent to the gate insulating layer is more than 20%, and Ge concentration in a portion of the second polysilicon gate adjacent to the gate insulating layer is below 10%. Alternatively, the Ge concentration in the portion of the first polysilicon gate adjacent to the gate insulating layer can be formed of more than 30%.

In the embodiment, Ge concentration in the first polysilicon gate is abruptly reduced when the distance from the gate insulating layer is more than a given level, i.e., at a top portion thereof, to have its minimum value. In one embodiment, the minimum value of Ge concentrations is set to be below ½ as compared with a maximum value thereof. Also, Ge concentration in the second polysilicon gate is uniformly distributed in the range of deviation of 20% according to the distance from the gate insulating layer.

According to another aspect of the present invention, there is provided a method of manufacturing a CMOS semiconductor device. In accordance with the method, a gate insulating layer on a substrate is formed on a substrate. A SiGe layer having a Ge content of more than 20% is formed on the gate insulating layer. A silicon layer is formed on the SiGe layer. An ion implantation mask is formed on the silicon layer to cover at least one PMOS transistor region. An n-type impurity ion implantation process is performed on at least one NMOS transistor region of the substrate having the ion implantation mask. A diffusion and annealing process for controlling a distribution of Ge concentration is performed on the substrate in which n-type impurities are implanted. A gate pattern for PMOS and NMOS transistors is formed by patterning the silicon layer and the SiGe layer.

In a preferred embodiment of the invention, the method further includes forming a polysilicon seed layer before forming the SiGe layer. Preferably, the seed layer is formed of a thickness of below 100 Å.

The method of the present invention further includes performing an ion implantation process to form source/drain regions in each of the NMOS and PMOS transistor regions. The method also includes performing an annealing process.

A p-type impurity ion implantation process on at least one PMOS transistor region is generally carried out along with an ion implantation process for forming source/drain regions in the PMOS transistor region. In each of the NMOS and PMOS transistor regions, source/drain regions having dual doped structures are formed by performing a light ion implantation, forming spacers on side walls of the gate pattern and performing a heavy ion implantation using the spacers and the gate pattern as a mask.

Once the ion implantation processes for forming source/drain regions are finished, subsequent heat treatment is restrained due to concern of impurity redistribution. Therefore, it is preferable that the diffusion and annealing process be carried out before performing the ion implantation process for forming source/drain regions.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
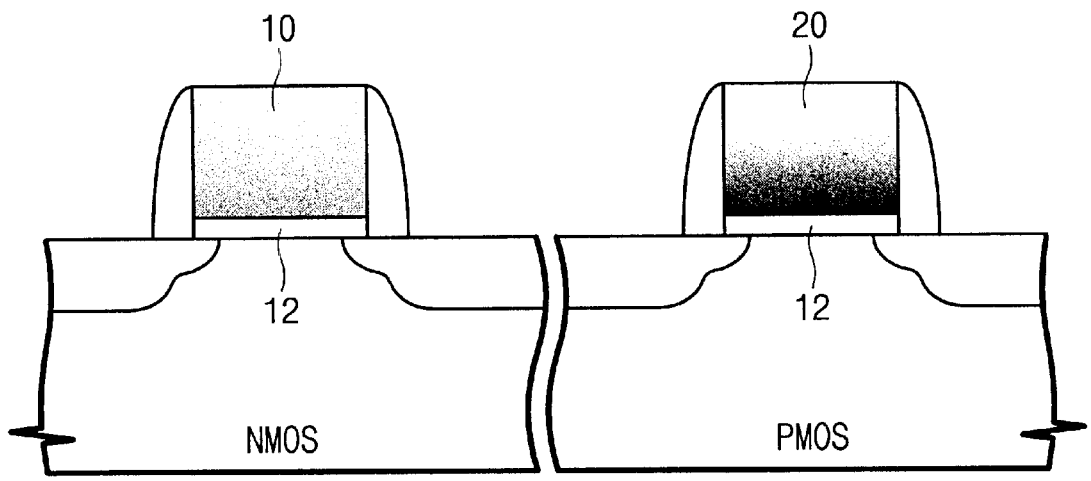
FIG. 1 is a cross-sectional view of a portion of CMOS semiconductor device in accordance with the present invention, showing Ge concentration in a portion of a NMOS transistor by contrast with that in a portion of a PMOS transistor.

FIG. 1 is a cross-sectional view of a portion of a CMOS semiconductor device in accordance with one embodiment of the present invention, showing Ge concentration in a portion of a NMOS transistor by contrast with that in a portion of a PMOS transistor.

Referring to FIG. 1, in a NMOS transistor region, Ge concentration in a polysilicon layer portion 10 forming a gate shows a distribution which is gradually reduced from a gate insulating layer 12. That is, the more the closer the polysilicon layer portion 10 is to the gate insulating layer 12, the greater the Ge concentration therein. Also, in a PMOS transistor region, Ge concentration in a polysilicon layer portion 20 forming a gate shows a distribution which is abruptly changed or diverged from the middle of the polysilicon layer portion 20. That is, one half of the polysilicon layer portion 20 adjacent to the gate insulating layer 12 has Ge concentration higher than that of the polysilicon layer portion 10, but the other half thereof has a very low Ge content.

Figure 2:
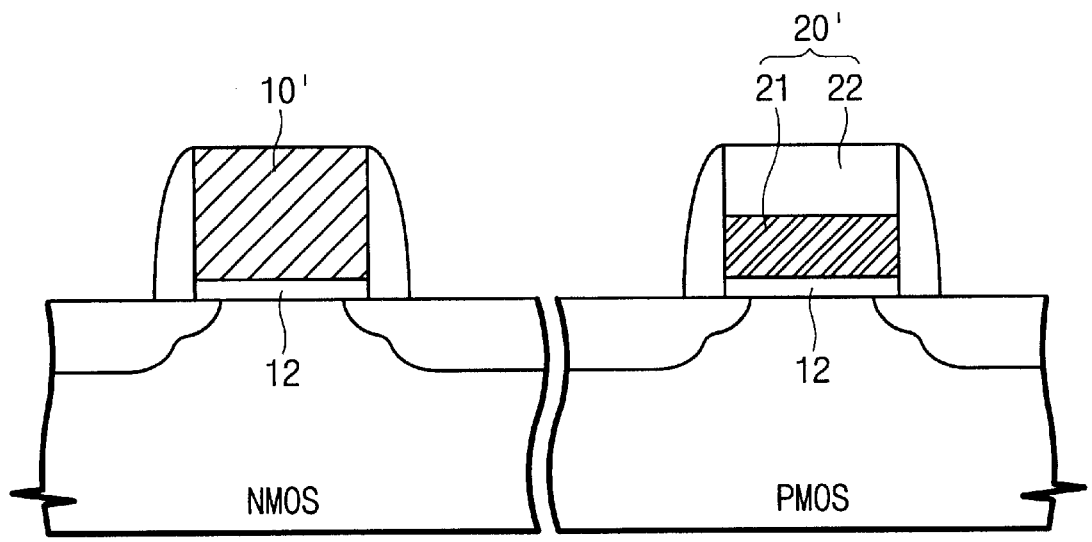
FIG. 2 is a cross-sectional view showing schematically the portion of CMOS semiconductor device shown in FIG. 1.

FIG. 2 schematically shows the polysilicon layer portions 10, 20 of the CMOS semiconductor device shown in FIG. 1. In a NMOS transistor region, Ge concentration in a polysilicon layer portion 10' forming a gate has an uniform distribution, and in a PMOS transistor region, Ge concentration in a lower portion 21 of a polysilicon layer portion 20' has a high and uniform distribution, but an upper portion 22 thereof has no Ge content.

According to the present invention, the CMOS semiconductor device can be formed to have a distribution of Ge concentration close to the ideal shape described above.

Figure 3:
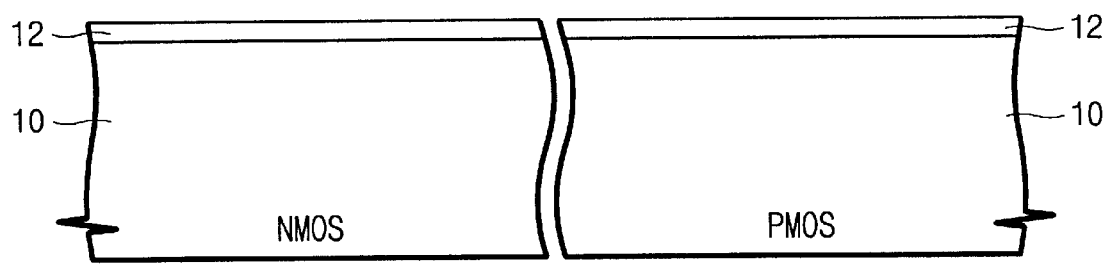
FIGS. 3 through 10 are flow diagrams showing the process steps of a method of manufacturing the CMOS semiconductor device in accordance with the present invention.

FIG. 3 to FIG. 9 are cross-sectional views showing the process of forming a CMOS type semiconductor device. Referring now to FIG. 3, a gate insulating layer 12 is formed on a substrate 10. Generally, before forming the gate insulating layer 12, an isolation layer and various wells are formed on the substrate 10 by means of shallow trench isolation (STI) and ion implantation processes, respectively. The gate insulating layer 12 can be formed to a thickness of 40 to 70 Å. Alternatively, thickness of the gate insulating layer 12 in a PMOS transistor region can be formed different from that of a NMOS transistor region. For example, in a dual gate type CMOS semiconductor device, the gate insulating layer 12 in the PMOS transistor region is often formed to 20 to 40 Å to increase performance and integration degree of the semiconductor device. Also, the gate insulating layer 12 can be composed of a silicon nitride-oxide layer as well as a silicon oxide layer which is usually formed by oxidizing the substrate at a high temperature.

Figure 4:
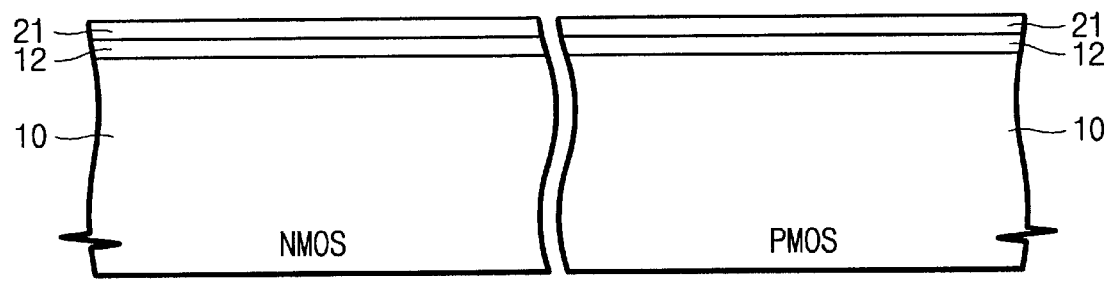

Referring to FIG. 4, a polysilicon seed layer 21 is formed to a thickness of 1 to 100 Å over the substrate on which the gate insulating layer 12 is formed. Alternatively, forming of the polysilicon seed layer 21 can be omitted. However, to form efficiently a SiGe layer 23 having a high Ge concentration which will be described below, the seed layer 21 is usually formed on the gate insulating layer 12 before forming the SiGe layer 23. The seed layer 21 can be formed of amorphous silicon instead of polysilicon. It is preferable that the seed layer 21 have a minimum thickness required to perform function of its own, for example about 5 Å. The polysilicon seed layer 21 is formed by means of a general CVD process which injects a source gas such as $SiH_4$ gas while maintaining the process chamber at a temperature of 550 to 600° C. and a pressure of several Torr or atmospheric pressure.

Figure 5:
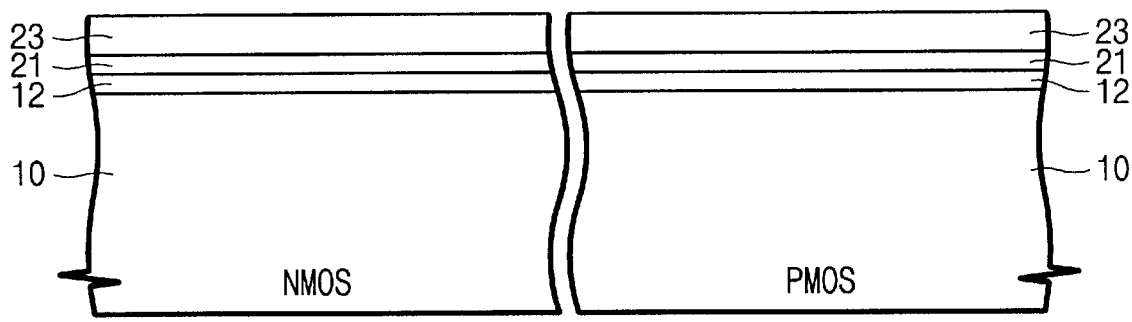

Referring to FIG. 5, a polycrystalline SiGe (poly-SiGe) layer 23 having Ge content or concentration of more than 20% is formed on the polysilicon seed layer 21. As described with reference to the above conventional techniques, the Ge content of 20% is an amount suitable to allow Ge to prevent boron impurities from being diffused into the gate insulating layer 12 and a channel layer. To increase performance of the dual gate type CMOS semiconductor device, if it is required to dope boron impurities more highly in the polysilicon gate, increasing Ge concentration of the poly-SiGe layer 23 to more than 30% is required.

The poly-SiGe layer 23 is formed under condition similar to that in forming of the polysilicon seed layer 21. For example, a CVD process, which controls Ge concentration at 20 to 40% by supplying $GeH_4$ gas to 30 to 100 sccm and $SiH_4$ gas at 200 sccm under a temperature of 500 to 600° C., is carried out. Crystallization temperature of poly-SiGe is generally 400 to 500° C., but if Ge content is increased, the crystallization temperature can be lowered. Also, in CVD process, it is not easy to precisely control a ratio of Ge to silicon. Therefore, it is preferable that to provide a process margin, the poly-SiGe layer 23 have sufficiently small thickness and thereby prevent Ge content in the whole gates of NMOS transistors from becoming overabundant even though Ge concentration in the poly-SiGe layer 23 has a surplus. Alternatively, the poly-SiGe layer 23 can be replaced with an amorphous SiGe layer.

Figure 6:
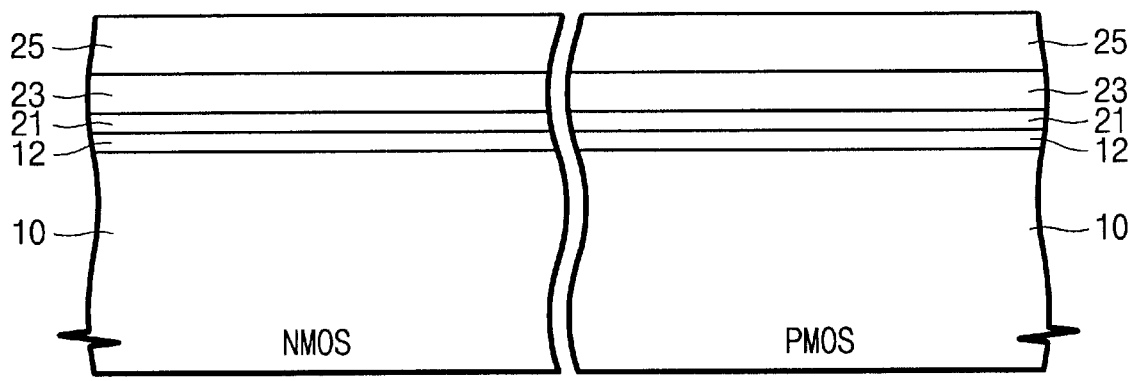

Referring to FIG. 6, After forming of the poly-SiGe layer 23, an additional silicon layer 25 forming a portion of a whole gate layer is deposited. It is preferable that the additional silicon layer 25 be formed of a polysilicon layer under the same condition as that of the polysilicon seed layer 21. For example, the additional silicon layer 25 can be formed by means of a general CVD process which supplies a source gas such as $SiH_4$ gas with maintaining a process chamber at a temperature of 550 to 650° C. and a pressure of several Torr or atmospheric pressure. In a 0.1 μm type CMOS semiconductor device, total thickness of a gate layer formed as above, i.e., the seed layer 21, the poly-SiGe layer 23 and the additional silicon layer 25, is 1500 to 2500 Å.

In the present invention, when the additional silicon layer 25 is formed on the poly-SiGe layer 23 to form a gate layer, there is a restriction with reference to deposition thickness between two layer and Ge content of the poly-SiGe layer 23. Namely, according to the invention, in the gates of NMOS transistors, Ge in the poly-SiGe layer 23 forming a lower portion of the gate layer is uniformly diffused to the additional silicon layer 25 forming an upper portion of the gate layer. Ge concentration diffused to the whole of the gate layer has to be maintained below a required level. Accordingly, if Ge concentration in the poly-SiGe layer 23 is high and thickness thereof is thick, thickness of the additional silicon layer 25 has to be thicker in proportion to the thickness and Ge content of the poly-SiGe layer 23. However, since total thickness of the gate layer is limited to 1500 to 2500 Å, the thickness of the poly-SiGe layer 23 has to be properly decreased if its Ge concentration is more than 50%.

For example, if thickness of the polysilicon seed layer 21 is 50 Å, thickness and Ge concentration of the poly-SiGe layer 23 are respectively 500 Å and 30%, and Ge concentration in the gates of the NMOS transistors has to be maintained below 10%, thickness of the additional silicon layer 25 is formed to more than 950 Å.

In a general PMOS transistor region, if Ge concentration of the poly-SiGe layer 23 is 20 to 30%, boron impurities can be sufficiently restrained from being depleted into the lower layer such as the gate insulating layer even though thickness of the poly-SiGe layer 23 is several hundred Å. Thus, it is unnecessary for the poly-SiGe layer 23 to have a large thickness.

Figure 7:
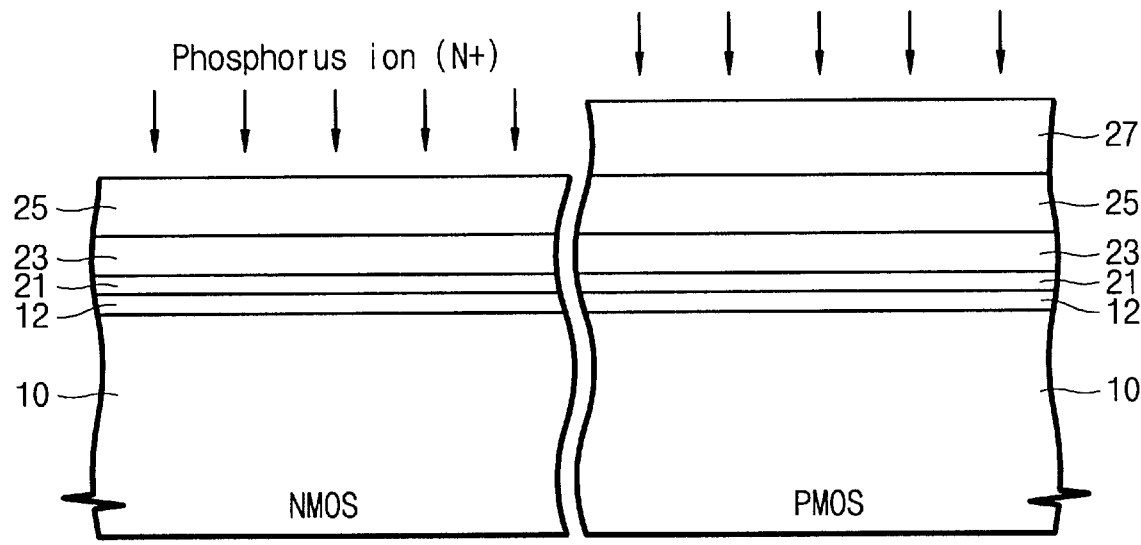

Referring to FIG. 7, a photo-resist is applied on the additional silicon layer 25 and a photo-resist pattern 27 is formed by means of photo-exposure and development. Then, an ion implantation process which uses the photo-resist pattern 27 as an ion implantation mask and phosphorus as a n-type impurity is carried out. As a result, impurity concentration in the gate layer of the NMOS transistor region is increased. The ion implantation assists in diffusing Ge of the poly-SiGe layer 23 of the NMOS transistor region into the upper additional silicon layer 25 in a subsequent annealing process. Alternatively, arsenic can be used as a n-type impurity. In the ion implantation against the gate layer, a dose is $1.0 \times 10^{15}$ to $1.0 \times 10^{16}$ ions/cm$^2$ which is similar to or larger than that in ion implantation against source/drain regions, and an implant energy or acceleration voltage is in the range of 10 to 60 KeV. In the present invention, the dose and acceleration voltage have correlation with a distribution of Ge concentration. Accordingly, the optimum condition of ion implantation will be obtained through experiment or considering correlation factors by experience.

After performing the ion implantation against the gate layer of the NMOS transistor region, the photo-resist pattern 27 is removed and a diffusion and annealing process is carried out. As a result, Ge distribution in the gate layer is charged. Namely, under the influence of the ion implantation, Ge is diffused to be uniformly distributed over the whole of the gate layer of the NMOS transistor region. However, at the PMOS transistor region, Ge is mainly diffused only over the polysilicon seed layer 21 and the poly-SiGe layer 23 of the gate layer. In the diffusion and annealing process, there is no need to make the distribution of Ge concentration in the gate layer to be completely uniform. When a subsequent process such as an annealing or thermal oxidation process is carried out after ion implantation for forming source/drain regions, Ge will be again diffused to allow the distribution of Ge concentration in the gate layer to be completely unified.

The diffusion and annealing process can be performed using a rapid thermal processing (RTP) method which can easily control heat and reduce process time. Also, it is preferable that the diffusion and annealing process be carried out at a temperature of more than 900° C. higher than a general annealing temperature for 10 to 60 seconds. The diffusion and annealing time can be changed according to various factors. For example, the greater the thickness of the gate layer, the more the diffusion and annealing time is assigned. Also, the lower the temperature and time of the subsequent annealing process, the more the diffusion and annealing time is assigned. The diffusion and annealing process can be performed under oxygen atmosphere.

Figure 8:
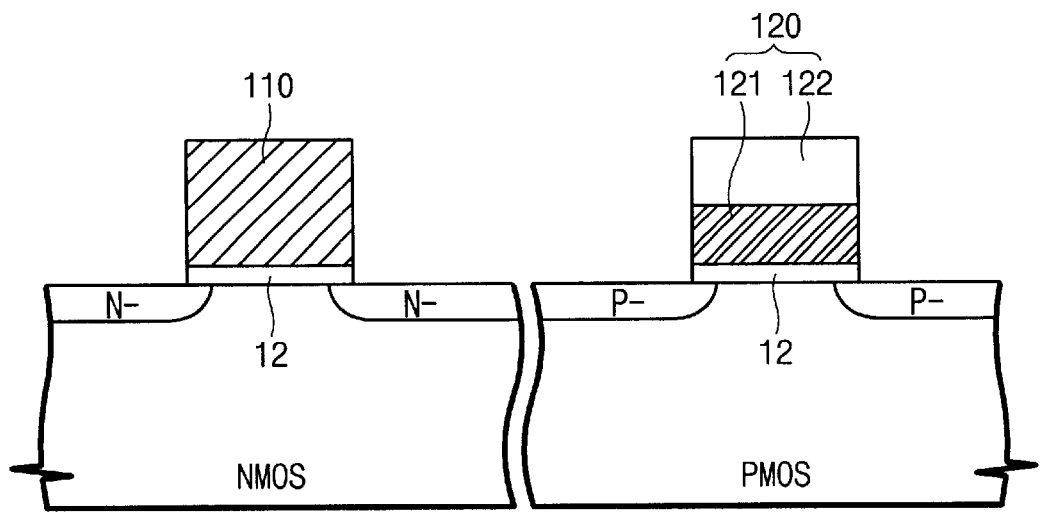

Referring to FIG. 8, gate pattern or gate electrodes 110, 120 of NMOS and PMOS transistors are formed by patterning the gate layer and the gate insulating layer 12. Patterning of the gate layer is carried out by means of a method of applying a photo-resist, forming a photo-resist pattern through photo-exposure and development, and etching the gate layer by using the photo-resist pattern as an etch mask. In addition, an annealing process for curing damages of side walls of the gate electrodes 110, 120 due to etching in patterning of the gate layer can be carried out. Alternatively, now, the diffusion and annealing process for redistributing Ge concentration described above, i.e., for distributing uniformly Ge concentration in the gate electrodes 110, 120 of the NMOS transistor region and increasing Ge concentration in the polysilicon seed layer portion of the gate electrodes 110, 120 of the PMOS transistor region, can be performed along with the annealing process for curing damages to the side walls of the gate electrodes 110, 120.

According to the result of the diffusion and annealing process for redistributing Ge, Ge distribution is uniform over the entire gate electrodes 110 of the NMOS transistor region. Also, in the gate electrodes 120 of the PMOS transistor region, Ge distribution in lower portions 121 including the seed layer portions is uniform to have relatively high Ge concentration. However, since in upper portions 122 of the gate electrodes 120, Ge is slightly diffused, Ge concentration in the upper portion 122 is very low.

After formation of the gate electrodes, an impurity implantation is carried out to form source/drain regions. The impurity implantation is mainly performed by an ion implantation. In the ion implantation, first, n-type impurity ions are highly implanted into portions of the NMOS transistor region in which the source/drain regions are to be formed. When the portions of the NMOS transistor region are implanted, portions of the PMOS transistor region in which the source/drain regions are to be formed are protected by means of an ion implantation mask. After implantation of the NMOS transistor region, p-type impurity ions are lightly implanted into the portion of the PMOS transistor region while protecting the portions of the NMOS transistor regions by means of an ion implantation mask. It should be noted that the embodiment is described as the portions of the NMOS transistor region being implanted before the portions of the PMOS transistor regions, but the portions of the PMOS transistor region can be implanted first.

Figure 9:
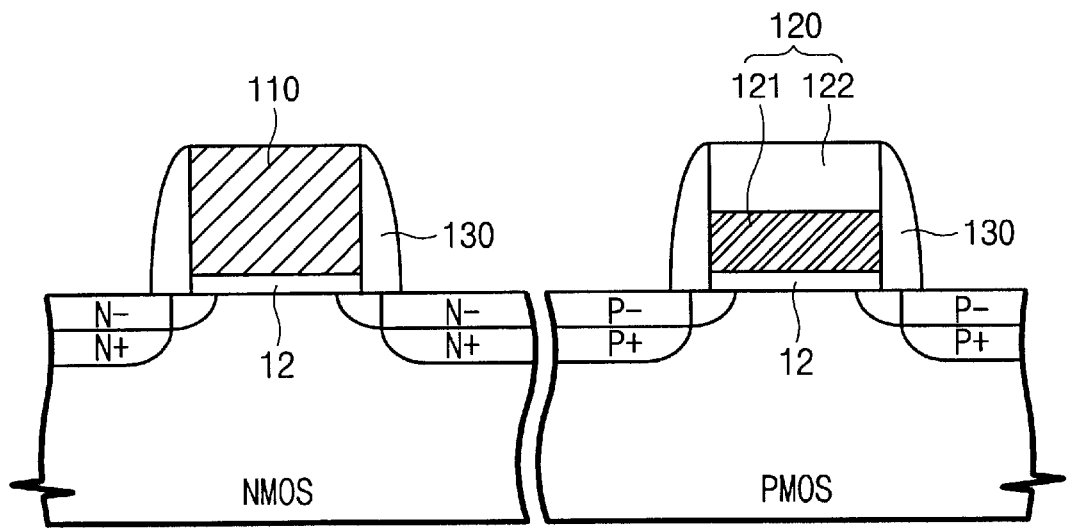

Referring to FIG. 9, after the light ion implantation of the NMOS and PMOS transistor regions, a conformal insulating layer is formed over a substrate and an anisotropic etching process is performed to form gate spacers 130 on side walls of the gate electrodes 110, 120. In a state the spacers 130 are formed, n-type and p-type impurity ions are heavily implanted into the portions of the NMOS and PMOS transistor regions, respectively. At this time, the spacers 130 and the gate electrodes 110, 120 function as an ion implantation mask. As a result, source/drain regions and channels having dual doped structures are formed. Alternatively, the source/drain regions can be formed by performing only the heavy ion implantation without the light ion implantation.

When the light and heavy ion implantation are carried out, boron ions are implanted as impurities into the gate electrodes 110, 120 and the source/drain regions of the PMOS transistor region. In the boron ion implantation, an acceleration voltage is 5 to 20 KeV which is several times as small as that in the n-type ion implantation and a dose is $1.0 \times 10^{15}$ to $1.0 \times 10^{16}$ ions/cm$^2$ which is similar to or slightly larger than that in the n-type ion implantation. It is preferable that since boron ions are generally diffused very well, the acceleration voltage be minimized.

Also, in the light and heavy ion implantation, arsenic ions are implanted as impurities into the gate electrodes and the source/drain regions of the NMOS transistor regions. In the arsenic ion implantation, an acceleration voltage is 10 to 60 KeV and a dose is $1.0 \times 10^{15}$ to $1.0 \times 10^{16}$ ions/cm$^2$, which are similar to that in the phosphorus ion implantation of the gate layer as described above.

Next, an annealing is carried out to compensate damages of the source/drain regions according to the ion implantation, and diffuse and activate the implanted ions. In the annealing process, temperature is below about 600° C. and process time is in the range of several seconds to several tens of seconds. The annealing process assists in diffusing Ge in the gate electrodes of the NMOS transistors and unifying Ge concentration. However, it will be appreciated that it is impossible to diffuse Ge completely or unify Ge concentration completely only by annealing in this step without performing a separate process such as the diffusion and annealing process described above, since recently, there is a growing tendency that reduces thermal burden in fabrication of the semiconductor device including the annealing process in this step.

Figure 10:
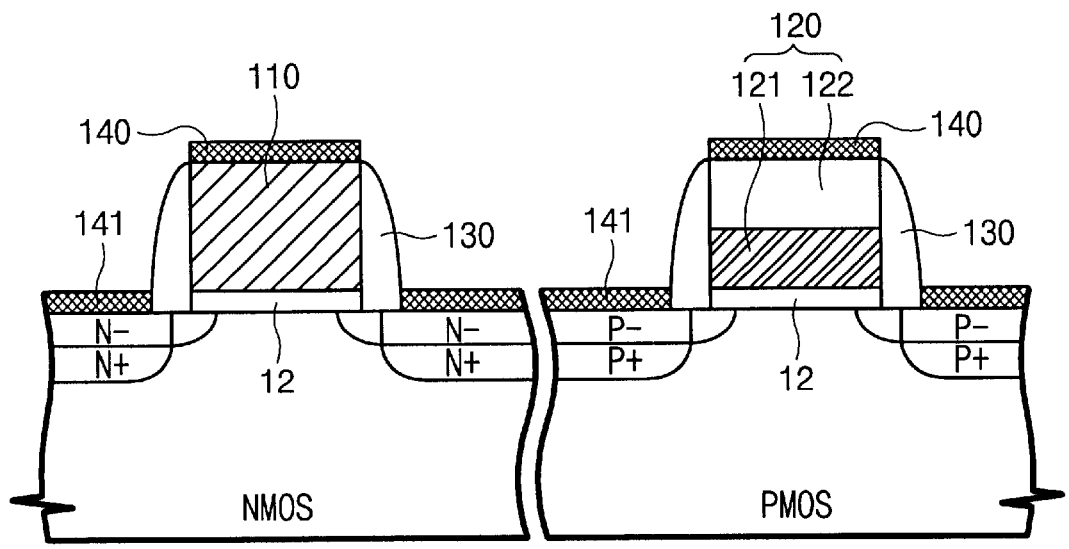

Referring to FIG. 10, a titanium or cobalt metal layer is deposited to a thickness of 100 to 300 Å over or on the substrate by means of a physical vapor deposition (PVD) or sputtering process, and an annealing process is carried out to transform the metal layer into a silicide layer. Then, the silicide layer is etched to remove all of the layer except portions deposited on the gate electrodes and exposed portion of the substrate. Portions 140 of the silicide layer disposed on the gate electrodes 110, 120 can be readily formed since Ge concentration in all the upper portions of the gate electrodes 110, 120 of the NMOS and PMOS transistor regions is below 10% to 5%. The upper portion 140 of the silicide layer can be formed to have a thickness thicker than that of portions 141 of the silicide layer disposed on the substrate. Also, in this step, the effect of activating implanted ions can be obtained according to annealing temperature.

FIG. 11 to FIG. 14 are graphs showing the results of experiments which illustrate the effect of the present invention. The experiments were carried out in consideration of conditions in the process steps of manufacturing an actual CMOS semiconductor device. For the experiments, first, a gate insulating layer Ox was formed on a substrate Sub. As described with reference to the preferred embodiment of the present invention, a polysilicon seed layer, a poly-SiGe layer and an additional polysilicon layer were formed in order on the gate insulating layer. To determine the degree of diffusion of Ge in each process step, the seed layer and the additional layer which are composed of polysilicon were formed to a sufficient thickness, i.e., about 500 Å, respectively. Then, a poly-SiGe layer having Ge content of 35% was formed to a thickness of about 1,000 Å.

Figure 11:
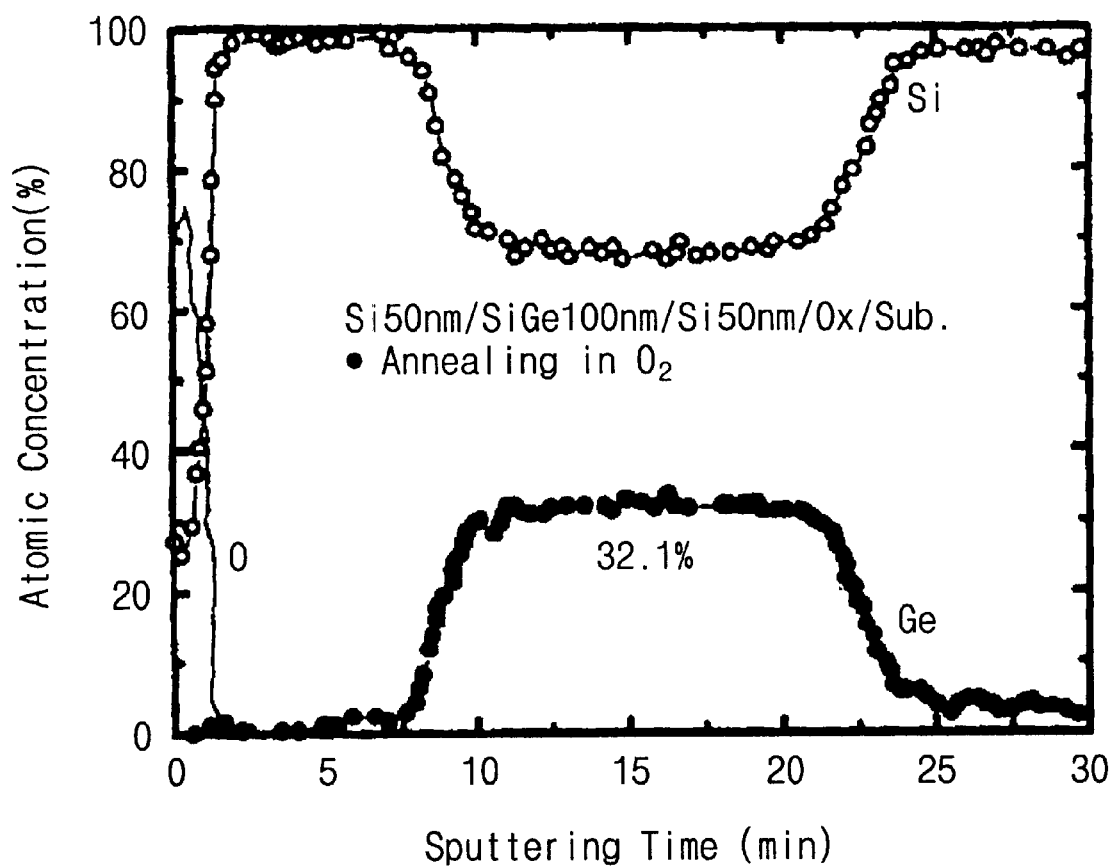
FIGS. 11 through 14 are graphs showing the results of experiments illustrating the effect of the present invention.

Referring to FIG. 11, a diffusion and annealing process was carried out against the polysilicon seed layer, the poly-SiGe layer and the additional polysilicon layer forming a gate layer under oxygen atmosphere without impurity implantation. The diffusion and annealing process was performed at more than 900° C. for 10 to 60 seconds by means of RTP apparatus. The results of the diffusion and annealing process were measured by means of an auger electron spectroscope. The auger electron spectroscope can analyze ingredient and content rate in the gate layer by injecting electron beams to an exposed surface of the gate layer and measuring an energy of auger electrons reflected from the exposed surface of the gate layer. In measuring to expose material layers in the gate layer and measure ingredient and its content rate therein, materials forming the gate layer were gradually removed from the upper surface thereof to the inside thereof. In the graph of FIG. 11, a horizontal axis shows the sputtering time at which electron beams were injected, and a vertical axis shows a concentration of atoms such as oxygen, Ge and silicon according to the sputtering time, i.e., depth from the upper surface of the gate layer. According to the graph, Ge concentration in the poly-SiGe layer is maintained at the same level as that when it was first formed. Accordingly, it can be appreciated that Ge is not diffused only by a simple heat treatment process such as the diffusion and annealing process described above.

Figure 12:
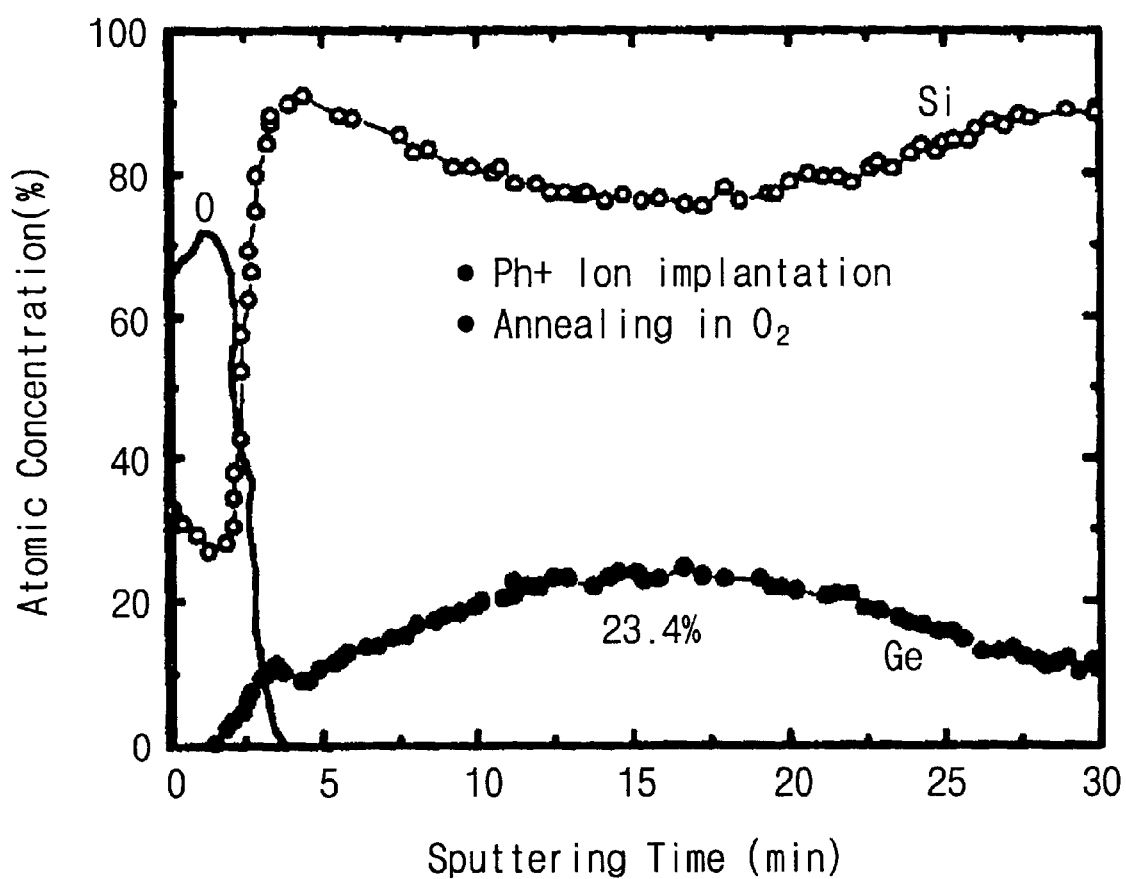

Referring to FIG. 12, under the same condition as the experiment of FIG. 11, a gate layer was formed and then a diffusion and annealing process was carried out. However, before performing the diffusion and annealing process, a phosphorus ion implantation process was carried out by forming an ion implantation mask to expose only a NMOS transistor region and then implanting phosphorus therein. In the ion implantation, a dose was about $5.0 \times 10^{15}$ ions/cm$^2$ and an acceleration voltage was about 20 KeV. The results for this experiment are shown in a graph of FIG. 12. According to the graph, thickness of surface oxides was increased and Ge in a poly-SiGe layer was largely diffused up and down from the viewpoint that maximum Ge concentration therein was largely lowered from 35% at first to 23.4%. Also, it can be appreciated that since Ge concentration in the surface oxides was abruptly reduced, it functions to act as a Ge diffusion stop layer. Although Ge concentration in the gate layer was not completely unified over the whole of the gate layer, Ge concentration in a seed layer was more than 10%. In a real process of forming a semiconductor device, the seed layer is formed to have very small thickness. Accordingly, it will be appreciated that at a PMOS transistor region, Ge can be diffused to an adjacent gate insulating layer.

Figure 13:
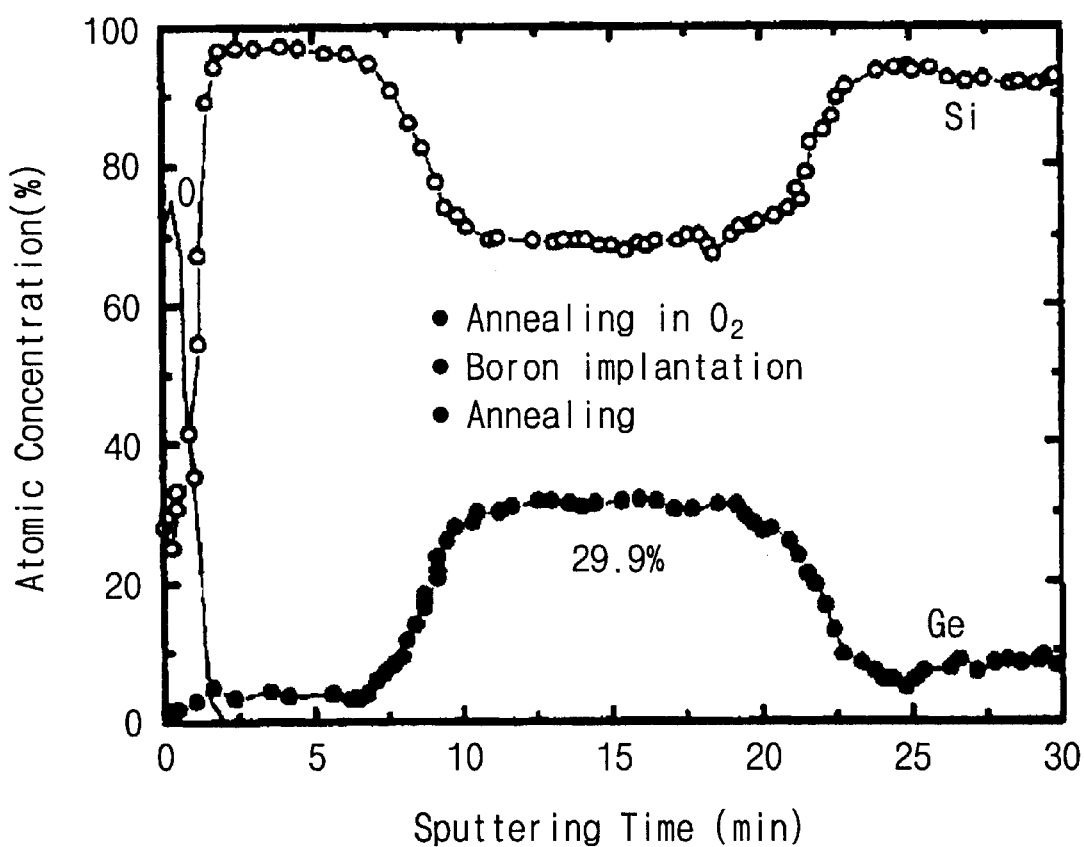

Referring to FIG. 13, a gate layer was formed under the same condition as the experiment of FIG. 11, and then a diffusion and annealing process in oxygen atmosphere, a boron ion implantation process and an annealing process for compensating damages due to ion implantation were carried out in order. The results for this experiment are shown in a graph of FIG. 13. According to the graph, Ge distribution in the gate layer was widened a small amount, and maximum Ge concentration in a high concentration region was reduced a small amount compared with the graph of FIG. 11, but Ge distribution in the gate layer was not different from that when it was first formed. In this experiment, the processes carried out against the gate layer are the same as those carried out against a gate layer of a PMOS transistor region in an actual process. Therefore, it can be inferred from the results that if a seed layer of the gate layer in the PMOS transistor region is sufficiently thin, for example below about 100 Å, Ge concentration in the seed layer will be distributed at a level similar to that of a poly-SiGe layer when it was first formed, but Ge will be scarcely diffused into an additional layer of the gate layer.

Figure 14:
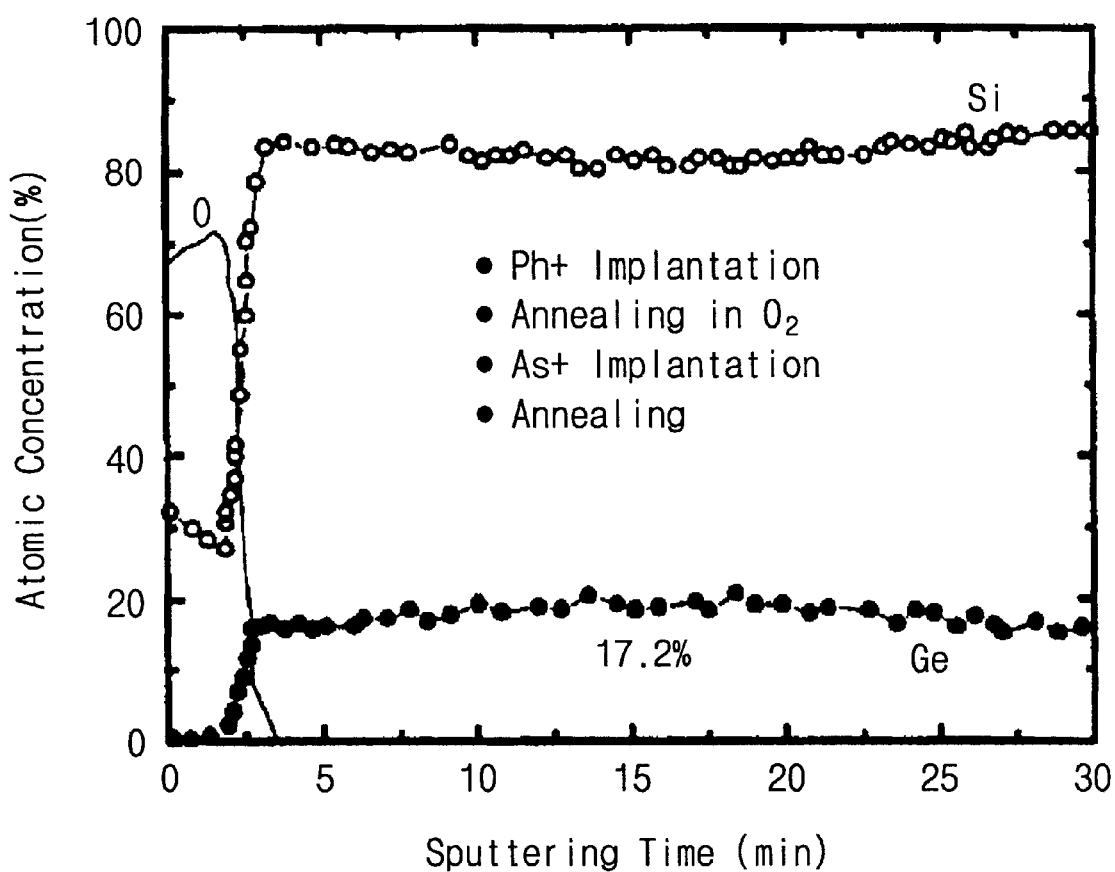

Referring to FIG. 14, a gate layer was formed under the same condition as the experiment of FIG. 11. Then, a phosphorus ion implantation process, a diffusion and annealing process in oxygen atmosphere, an arsenic ion implantation process for forming source/drain regions, and an annealing process for compensating damages due to ion implantation were carried out in order. The results for this experiment are shown in a graph of FIG. 14. According to the graph, Ge distribution was completely unified over the whole of the gate layer compared with that of FIG. 11. Ge concentration is the gate layer was about 17.2% which is a half of that, i.e., about 35% when it is first formed. Also, considering thickness of a polysilicon layer and a poly-SiGe layer, it can be appreciated that Ge was uniformly diffused over the whole of the gate layer.

As apparent from the foregoing description, it can be appreciated that the present invention provides a CMOS semiconductor device and method of manufacturing the same, which can make effective Ge concentration in a gate layer of a NMOS transistor region to be formed different from that of a PMOS transistor region, thereby preventing depletion of gate impurities and greatly increasing performance of the device.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method of manufacturing a CMOS semiconductor device comprising the steps of:

forming a gate insulating layer on a substrate;

forming a SiGe layer having Ge content of more than 20% on said gate insulating layer;

forming a silicon layer on said SiGe layer;

forming an ion implantation mask on said silicon layer to cover at least one PMOS transistor region;

performing a n-type impurity ion implantation process on at least one NMOS transistor region of said substrate having said ion implantation mask;

performing a diffusion and annealing process on said substrate in which n-type impurities are implanted to diffuse germanium into the silicon layer in the NMOS transistor region such that a desired germanium dopant profile is produced in the SiGe layer and the silicon layer in the NMOS transistor region, while germanium is substantially prevented from diffusing into the silicon layer in the PMOS transistor region; and forming a gate pattern for PMOS and NMOS transistors by patterning said silicon layer and said SiGe layer.

2. The method according to claim 1, further including forming a polysilicon seed layer before forming said SiGe layer.

3. The method according to claim 2, wherein said seed layer is formed to a thickness of below 100 Å.

4. The method according to claim 1, wherein said SiGe layer and said silicon layer comprise a polycrystalline SiGe layer and a polysilicon layer, respectively.

5. The method according to claim 1, further including performing an ion implantation process for forming source/drain regions in each of said NMOS and PMOS transistor regions.

6. The method according to claim 5, wherein said source/drain regions have dual doped structures.

7. The method according to claim 5, wherein impurities implanted in said PMOS transistor region in said ion implantation process comprise boron ions.

8. The method according to claim 5, further including performing an annealing process after performing said ion implantation process.

9. The method according to claim 5, further including forming at least one metal silicide layer portion on at least a portion of said gate pattern by forming a metal layer over at least a portion of said substrate having said gate pattern and then performing a heat treatment process.

10. The method according to claim 5, wherein performing said diffusion and annealing process is carried out before performing ion implantation process for forming source/drain regions.

11. The method according to claim 5, wherein impurities implanted in said NMOS transistor region in said ion implantation process comprise arsenic ions.

* * * * *